(12) United States Patent  (10) Patent No.: US 7,567,441 B2
Monda et al.  (45) Date of Patent: Jul. 28, 2009

(54) ELECTRONIC EQUIPMENT

(75) Inventors: Tomoko Monda, Yokohama (JP); Minoru Mukai, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 80 days.

(21) Appl. No.: 11/899,783

(22) Filed: Sep. 7, 2007

(65) Prior Publication Data
US 2008/0068814 A1 Mar. 20, 2008

(30) Foreign Application Priority Data
Sep. 19, 2006 (JP) ............................ 2006-253429

(51) Int. Cl.
*H05K 5/00* (2006.01)
(52) U.S. Cl. .................. 361/752; 361/807; 361/810
(58) Field of Classification Search .............. 361/752, 361/790, 797, 800, 760, 720, 736, 748, 807, 361/810, 679, 715, 759; 174/138 G, 138 E
See application file for complete search history.

(56) References Cited

U.S. PATENT DOCUMENTS

| 2,560,212 | A | * | 7/1951 | Byrd et al. | 439/384 |
| 5,321,585 | A | * | 6/1994 | Trittschuh et al. | 361/784 |
| 6,115,259 | A | * | 9/2000 | Karner | 361/759 |
| 6,813,147 | B2 | * | 11/2004 | Jeong | 361/679.06 |
| 7,265,973 | B2 | * | 9/2007 | Lanni | 361/695 |
| 2008/0310130 | A1 | * | 12/2008 | Monda et al. | 361/752 |

FOREIGN PATENT DOCUMENTS

| JP | 11-298169 | 10/1999 |
| JP | 2001-7550 | 1/2001 |

* cited by examiner

*Primary Examiner*—Hung S Bui
(74) *Attorney, Agent, or Firm*—Ohlandt, Greeley, Ruggiero & Perle, L.L.P.

(57) ABSTRACT

An electronic equipment is provided with a housing which is assembled by combining first and second cases. The first and second cases are provided with first and second projections on inner surfaces of the first and second cases. A circuit board is located in the housing, which has a hole having a diameter larger than those of the first and second projections. The first and second projections are so engaged with each other as to be inserted in the hole. Stoppers are provided around the first and second projections so as to form gaps between first and second projections and the circuit board.

15 Claims, 4 Drawing Sheets

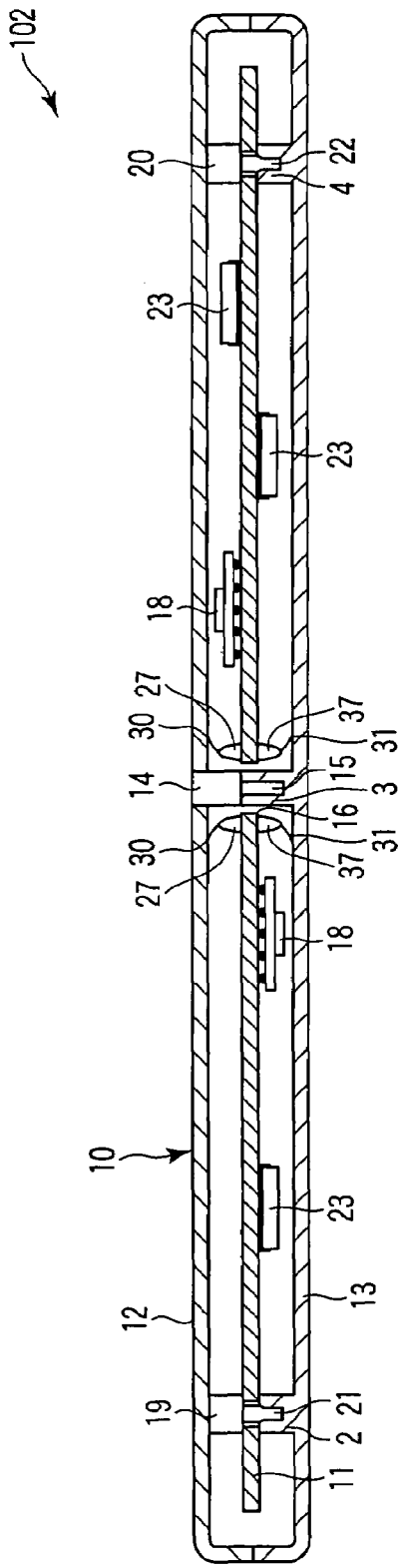
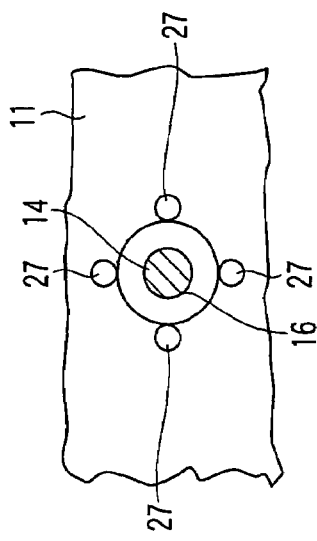
F I G. 2A
F I G. 2B

ELECTRONIC EQUIPMENT

CROSS-REFERENCE TO RELATED APPLICATIONS

This application is based upon and claims the benefit of priority from prior Japanese Patent Application No. 2006-253429, filed Sep. 19, 2006, the entire contents of which are incorporated herein by reference.

BACKGROUND OF THE INVENTION

1. Field of the Invention

The present invention relates to an electronic equipment.

2. Description of the Related Art

With the advancement in multi-functionality and higher performance of electronic equipments, circuit boards are made to have higher integration, and the number of parts to be mounted on the circuit board has been increased. Accordingly, the number of electric joints between electronic components and electronic circuits on the circuit board have become enormously large, and thus a problem has been caused that reliability of the electric connection at the joints cannot be easily maintained with respect to thermal stress or external stress.

Thus, in order to relieve the stress particularly on the periphery of a boss in which thermal stress or external stress concentrates, a method is proposed in JP-A 11-298169 (KOKAI), in which an elastic body is interposed between the boss and the joint of the circuit board. In the method disclosed in JP-A 11-298169 (KOKAI), the stress is relieved by interposing an elastic body between the boss and the joint of the circuit board. However, the method is regarded as being insufficient to maintain reliability at the joints of electronic components which will hereafter undergo further higher densification.

BRIEF SUMMARY OF THE INVENTION

According to a first aspect of the present invention, there is provided an electronic equipment comprising:

a housing having a hollow cavity, comprising first and second cases, the first case having a first inner surface and a first projection formed on the inner surface, the second case having a second inner surface and a second projection formed on the second inner surface, the second projection being engaged with the first projection;

a circuit board which is provided in the hollow housing, has a hole having a diameter larger than those of the first and second projections, and is arranged in such a manner that the first projection or the second projection is inserted in the hole; and a first stopper provided around one of the first and second projections so as to provide a gap between the first stopper and the circuit board.

According to a second aspect of the present invention, there is provided an electronic equipment comprising:

a housing having a hollow cavity, comprising first and second cases, the first case having a first inner surface and a first projection formed on the inner surface, the second case having a second inner surface and a second projection formed on the second inner surface, the second projection being engaged with the first projection;

a circuit board which is provided in the hollow housing, has a hole having a diameter larger than those of the first and second projections, and is arranged in such a manner that the first projection or the second projection is inserted in the hole; and first stoppers arranged around the hole on one of front and rear surfaces of the circuit board so as to provide gaps between the first stoppers and the one of the first and second inner surfaces.

Further, according to a third aspect of the present invention there is provided an electronic equipment comprising:

a housing having a hollow cavity, comprising first and second cases, the first case having a first inner surface and a first projection formed on the inner surface, the second case having a second inner surface and a second projection formed on the second inner surface, the second projection being engaged with the first projection;

a circuit board which is provided in the hollow housing, has front and rear surfaces and a hole having a diameter larger than those of the first and second projections, and is arranged in such a manner that the first projection or the second projection is inserted in the hole; and first stoppers provided around one of the first and second projections, respectively; and second stoppers provided around the hole on one of the front and rear surfaces which faces to the one of the first and second projections so as to provide gaps between the first stoppers and the second stoppers.

BRIEF DESCRIPTION OF THE SEVERAL VIEWS OF THE DRAWING

FIGS. 2A and 2B are a cross-sectional view schematically showing an electronic equipment according to a second embodiment, and a partial cross-sectional view schematically showing a shape of a boss section and an arrangement of stoppers shown in FIG. 2A.

DETAILED DESCRIPTION OF THE INVENTION

Electronic equipment according to an embodiment of the present invention will be described below with reference to the accompanying drawings.

Figure 1A:
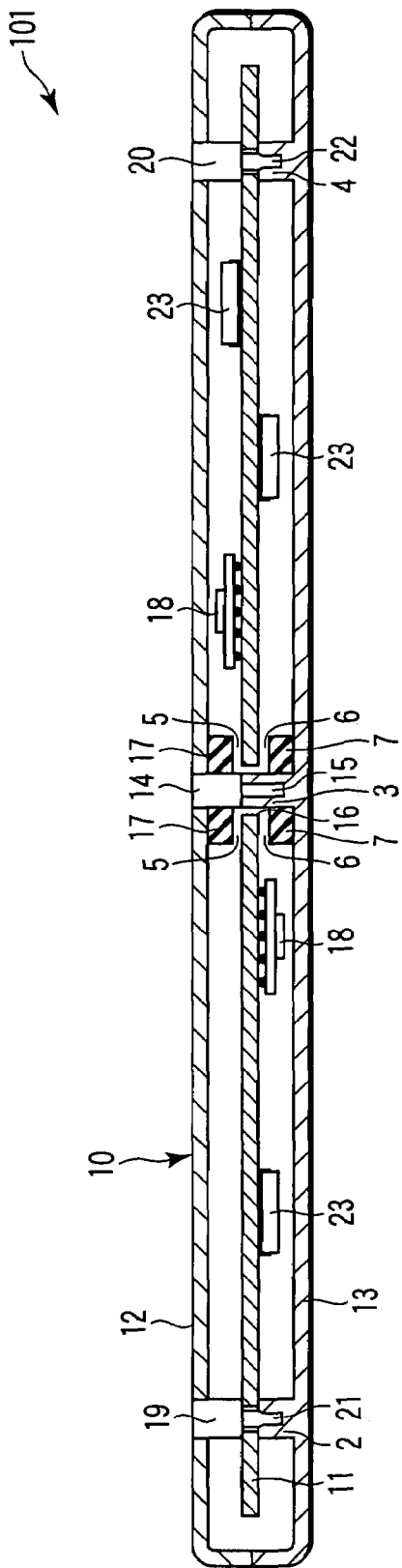
FIGS. 1A and 1B are a cross-sectional view schematically showing an electronic equipment according to a first embodiment, and a perspective view schematically showing a boss section shown in FIG. 1A.
Figure 1B:
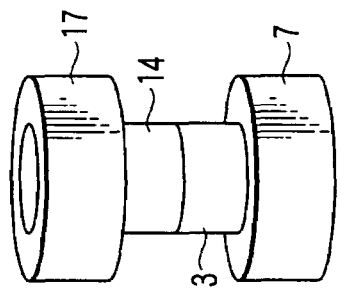

FIG. 1A shows the electronic equipment according to a first embodiment of the present invention, and FIG. 1B is an enlarged view of a boss section and a cylindrical stopper, shown in FIG. 1A, which is provided at a proximal part of the boss section.

The electronic equipment 101 comprises a hollow housing 10 in which a circuit board 11 is accommodated and fixed. The housing 10 is constituted in such a manner that an upper case 12 having a lid-like shape and a lower case 13 are combined with each other so as to form a cavity inside them. Electronic components 18 and 23 are mounted on the circuit board 11.

Boss sections 14, 19, and 20 are formed inside the upper case 12 so as to allow them to project from the inner surfaces of upper case 12, and boss sections 3, 2, and 4 are formed also inside the lower case 13 so as to allow them to project from the inner surfaces of the lower case 13. In this structure, the boss sections 2 and 4 are provided in relatively circumferential regions of the lower case 13. Likewise, the boss sections 19 and 20 are also provided in relatively circumferential regions of the upper case 12 so as to correspond to the boss sections 2 and 4, respectively. Further, the boss section 3 is provided in a region of the lower case 13 between the boss sections 2 and 4. The boss section 14 is also provided in a region of the upper case 12 between the boss sections 19 and 20 so as to correspond to the boss section 3. When the upper case 12 and the lower case 13 are assembled into the housing 10, the boss sections 3, 2, and 4 of the lower case 13 are engaged with the boss sections 14, 19, and of the upper case 12, respectively, and the lower case 13 is fixed to the upper case 12 to form the housing 10. More specifically, the boss sections 14, 19, and 20 of the upper case 12 each have pedestal sections and male screws 21, 15, and 22 projecting from the pedestal sections. Likewise, the boss sections 3, 2, and 4 of the lower case 13 each have pedestal sections and female threaded holes 21, 15, and 22 formed in the pedestal sections, to be screw-engaged with the male screws 21, 15, and 22. The male screws 21, 15, and 22 of the boss sections 14, 19, and 20 are screw-engaged with the female threaded holes of the boss sections 3, 2, and 4, respectively, thereby joining the upper case 12 and the lower case 13 to each other. Further, the boss sections 3 and 14 are respectively provided with stoppers 7 and 17 having a cylindrical flange-like shape swelling out from the proximal parts of the pedestal sections at the pedestal sections. That is, the stoppers 7 and 17 have through holes in which the boss sections 3 and 14 are inserted and the stoppers 7 and 17 are fixed around the pedestal section of the boss sections 3 and 14, respectively.

The circuit board 11 has holes in which the male screws 21 and 22 of the boss sections 19 and 20 are inserted. A diameter of the holes is determined in such a manner that it is larger than a diameter of the male screws 21 and 22 of the boss sections 19 and 20, and is smaller than that of the pedestal sections of the boss sections 2 and 4 and the boss sections 19 and 20. Accordingly, when the male screws 21 and 22 of the boss sections 19 and 20 are screw-engaged with the female threaded holes of the boss sections 2 and 4, the pedestal sections of the boss sections 2 and 4 and the boss sections 19 and 20 are brought into contact with the circuit board 11, and the circuit board 11 is pinched between the pedestal sections of the boss section 2 and the boss section 19, and between the pedestal sections of the boss section 4 and the boss section 20 so as to be fixed.

Further, the circuit board 11 also has a hole 16 in a center region of the circuit board, in which the pedestal section of the boss section 3 and the pedestal section of the boss section 14 are inserted. A diameter of the hole 16 is determined in such a manner that it is larger than a diameter of the pedestal sections of the boss section 3 and the boss section 14, and is smaller than that of the flange-like stoppers 7 and 17. Accordingly, when the male screw 15 of the boss section 14 is screw-engaged with the female threaded hole of the boss section 3, the pedestal sections of the boss section 14 and the boss section 3 are brought into contact with each other, and the flange-like stoppers 7 and 17 are arranged in such a manner that gaps 5 and 6 are held between the stoppers 7 and 17 and the circuit board 11.

As described above, in the boss sections 19 and 2, boss sections 14 and 3, and boss sections 20 and 22, the male screws 21, 15, and 22 are screw-engaged with the corresponding female threaded holes, so as to allow the upper case 12 and lower case 13 to constitute the housing 10, thereby fixing the circuit board 11 between the upper case 12 and the lower case 13. Incidentally, the boss section 19 and boss section 2, the boss section 20 and boss section 4 are fixed to each other by the screws 21 and 22, their pedestal sections are in contact with the circuit board 11, thereby fixing the circuit board 11 inside the housing 10. However, a structure is employed in which the boss section 14 and boss section 3 penetrate the hole 16 provided in the circuit board 11, their pedestal sections are in contact with each other, but the pedestal sections are not in contact with the circuit board 11, and the circuit board 11 is not fixed to the boss section 14 and boss section 3. Accordingly, a structure is employed in which if thermal stress or external stress is applied to the circuit board 11 and the circuit board 11 is deformed, although the thermal stress or external stress is applied to the regions of the circuit board around the boss sections 19 and 2 boss sections 20 and 4, the thermal stress or external stress is not applied to the region of the circuit board 11 around the boss section 14 and boss section 3 provided between the boss sections 19 and 2 and the boss sections 20 and 4 in a concentrated manner. Accordingly, an adverse influence of the thermal stress or external stress on the soldered connections of the electronic components 18 arranged on the circuit board 11 between the boss sections 19 and 2 and the boss sections 20 and 4, particularly, on the soldered connections of the electronic components 18 arranged in the region on the circuit board 11 in the vicinity of the boss sections 14 and 3 can be alleviated.

Further, when large external impact is made on the housing 10, since gaps 5 and 6 are provided between the stoppers 5 and 7 and the circuit board 11, the stoppers 5 and 7 can suppress large deformation of the circuit board 11 and limit the change of the circuit board 11 itself. Accordingly, it is possible to prevent the electronic components 18 from colliding against the upper case 12 and lower case 13. The distances of the gaps 5 and 6 held between the stoppers 17 and 7 and the circuit board 11 are set within a range in which the electronic components 18 adjacent to the stoppers 17 and 7 do not collide against the upper case 12 and lower case 13, respectively. Further, it is desirable that the gaps 56 held between the stoppers 17 and 7 and the circuit board 11 be set outside a range in which the circuit board 11 is deformed by the temperature variation in the usage environment of the electronic components 18, and the electronic components 18 are shifted. That is, it is desirable that the range of the shift be set larger than the value by which the surface of the circuit board 11 is shifted in the direction toward the outside (vertical direction in the drawing) so as to be deformed.

By configuring the case so as to allow it to have the structure described above, it becomes possible to enhance the connection reliability of the circuit board 11 and the electronic components 18, and improve the reliability with respect to excessive deformation caused by impact.

It is desirable that the stoppers 17 and 7 provided around the boss sections 14 and 3 be made of an elastic body from the viewpoint of impact absorption. As for the material of the stoppers 17 and 7, although the modulus of elasticity of the circuit board 11 is about several tens of Gpa at room temperature, it is necessary for the material to be more flexible, and thus it is desirable that the material of the stoppers 17 and 7 should have a modulus of elasticity of about several Mpa to several tens of Mpa.

In the housing structure shown in FIG. 1, although the stoppers 17 and 7 are provided for both the boss sections 14 and 3, a structure in which one of the stoppers 17 and 7 is provided for one of the boss sections 14 and 3 may be employed. Even in such a structure, it becomes possible to enhance the connection reliability of the circuit board 11 and the electronic components 18, and improve the reliability with respect to excessive deformation caused by impact.

FIG. 2A shows an electronic equipment according to a second embodiment of the present invention, and FIG. 2B is a cross-sectional plan view showing an arrangement of stoppers 27 shown in FIG. 2A, which are formed and arranged around a hole 16 of a circuit board 11.

The electronic equipment 102 comprises, like the housing structure shown in FIG. 1, an upper case 12 in which boss sections 14, 19, and 20 are formed, and a lower case 13 in which boss sections 14, 19, and 20, and boss sections 3, 2, and 4 to be engaged with the boss sections 14, 19, and 20. Further, like the housing structure shown in FIG. 1, a circuit board 11 is accommodated in the upper case 12 and the lower case 13, has a hole 16 having a diameter larger than those of the boss section 14 and boss section 3, and is arranged such that the boss section 14 and the boss section 3 penetrate the hole 16. In the housing structure shown in FIG. 2, unlike in the housing structure shown in FIG. 1, stoppers 17 and 7 are not provided at the proximal sections of the pedestal sections of the boss sections 14 and 3, and stoppers 27 and 37 are provided in regions around the hole 16 on the front and rear surfaces of the circuit board 11. These stoppers are each formed into a columnar shape, and are fixed to the board 11 in such a manner that gaps 30 and 31 are held between them and the upper case 12 and lower case 13. Electronic components 18 and 23 are mounted on the circuit board 11 like in the housing structure shown in FIG. 1.

Further, in the boss sections 19 and 2, boss sections 14 and 3, and boss sections 20 and 22, like in the housing structure shown in FIG. 1, male screws 21, 15, and 22 are screw-engaged with corresponding female threaded holes, thereby causing the upper case 12 and lower case 13 to integrally constitute a case. Incidentally, the boss section 19 and boss section 2, and the boss section 20 and boss section 4 fix the circuit board 11 to the inside of the housing by the screws 21 and 22. However, like in the housing structure shown in FIG. 1, the structure in which the boss section 14 and boss section 3 penetrate the hole 16, and the boss section 14 and boss section 3 are not fixed to the circuit board 11 is employed.

Accordingly, even when the circuit board 11 is deformed by thermal stress or external stress, the stress is prevented from being concentrated at the region of the circuit board 11 around the boss section 14 and boss section 3 because the boss section 14 and boss section 3 are not fixed to the circuit board 11. Accordingly, an adverse influence of the stress on the soldered connections of the electronic components 18, particularly, on the soldered connections of the electronic components 18 arranged in the region on the circuit board 11 in the vicinity of the boss sections 14 and 3 can be alleviated.

Further, when the external impact is large, variation of the circuit board 11 can be limited by the stoppers 27 and 37 formed into a columnar shape on the circuit board 11 around the hole 16. As a result, it is possible to prevent the electronic components 18 from colliding against the upper case 12 and lower case 13. In this case, the gaps 30 and 31 held between the stoppers 27 and 37 and the upper case 12 and lower case 13 are set such that the electronic components 18 adjacent to the stoppers 27 and 37 do not collide against the upper case 12 and lower case 13, respectively. Further, it is desirable that the gaps 30 and 31 between the stoppers 27 and 37 and the upper case 12 and lower case 13 be set larger than a deformation amount of the circuit board 11 in an out-of-surface direction (vertical direction in the drawing) in the temperature variation range in the usage environment of the electronic components 18.

By employing such a housing structure, it becomes possible to enhance the connection reliability of the circuit board 11 and the electronic components 18, and improve the reliability with respect to excessive deformation caused by impact or the like.

It is desirable that the columnar stoppers 27 and 37 be made of an elastic body. It is also desirable that the stoppers 27 and 37 be able to be formed by applying a resin such as an adhesive. As for the material of the stoppers 27 and 37, although the modulus of elasticity of the circuit board 11 is about several tens of Gpa, it is desirable that the value of the modulus of elasticity be a value sufficiently smaller than that of the circuit board 11, i.e., about several hundreds of Mpa to several Gpa.

In the housing structure shown in FIG. 2, although the stoppers 27 and 37 are provided on both the surfaces of the circuit board 11, one of the stoppers 27 and 37 may be provided on one of both the surfaces of the circuit board 11.

Figure 3A:
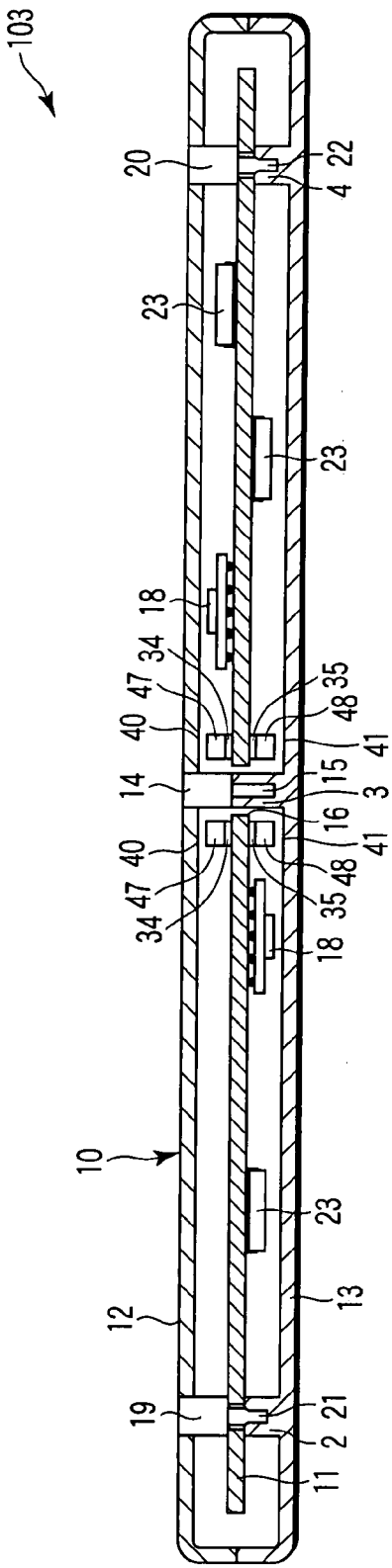
FIGS. 3A and 3B are a cross-sectional view schematically showing an electronic equipment according to a third embodiment, and a perspective view schematically showing a boss section and an arrangement of stoppers shown in FIG. 3A.
Figure 3B:
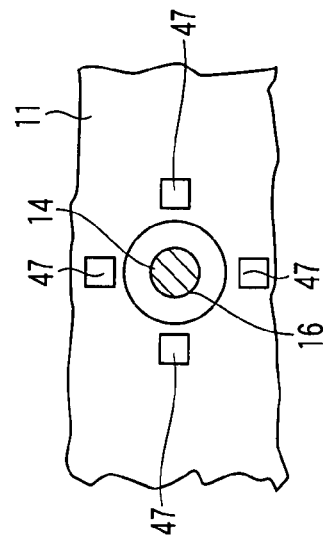

FIG. 3A is a cross-sectional view showing an electronic equipment according to a third embodiment of the present invention, and FIG. 3B is a view showing an arrangement of stoppers 47 formed on pads 34 as shown in FIG. 3A, which are formed and arranged around a hole 16 of a circuit board 11.

This electronic equipment 103 comprises, like the housing structure shown in FIG. 1, an upper case 12 in which boss sections 14, 19, and 20 are formed, and a lower case 13 in which boss sections 3, 2, and 4 to be engaged with the boss sections 14, 19, and 20 are formed. Further, like the housing structure shown in FIG. 1, a circuit board 11 is accommodated in the upper case 12 and the lower case 13, has a hole 16 having a diameter larger than those of the boss section 14 and boss section 3, and is arranged such that the boss section 14 and the boss section 3 penetrate the hole 16. In the housing structure shown in FIG. 3, unlike in the housing structure shown in FIG. 1, stoppers 17 and 7 are not provided at the proximal sections of the pedestal sections of the boss sections 14 and 3, and pads 34 and 35 are provided in regions around the hole 16 on the front and rear surfaces of the circuit board 11. Stoppers 47 and 48 each formed into a columnar shape are fixed to the pads 34 and 35 such that gaps 40 and 41 are held between them and the upper case 12 and lower case 13. Electronic components 18 and 23 are mounted on the circuit board 11, like in the housing structure shown in FIG. 1.

Further, in the boss sections 19 and 2, boss sections 14 and 3, and boss sections 20 and 22, like in the housing structure shown in FIG. 1, male screws 21, 15, and 22 are screw-engaged with corresponding female threaded holes, thereby causing the upper case 12 and lower case 13 to integrally constitute a case. Incidentally, the boss section 19 and boss section 2, and the boss section 20 and boss section 4 fix the circuit board 11 to the inside of the housing by the screws 21 and 22. However, like in the housing structure shown in FIG. 1, the structure in which the boss section 14 and boss section 3 penetrate the hole 16, and the boss section 14 and boss section 3 are not fixed to the circuit board 11 is employed.

Accordingly, even when the circuit board 11 is deformed by thermal stress or external stress, the stress is prevented from being concentrated at the region of the circuit board 11 around the boss section 14 and boss section 3 because the boss section 14 and boss section 3 are not fixed to the circuit board 11. Accordingly, an adverse influence of the stress on the soldered connections of the electronic components 18, particularly, on the soldered connections of the electronic components 18 arranged in the region on the circuit board 11 in the vicinity of the boss sections 14 and 3 can be alleviated.

Further, when the external impact is large, variation of the circuit board 11 can be limited by the stoppers 47 and 48 formed into a columnar shape on the circuit board 11 around the hole 16. As a result, it is possible to prevent the electronic components 18 from colliding against the upper case 12 and lower case 13. In this case, the gaps 40 and 41 held between the stoppers 47 and 48 and the upper case 12 and lower case 13 are set such that the electronic components 18 adjacent to the stoppers 47 and 48 do not collide against the upper case 12 and lower case 13, respectively. Further, it is desirable that the gaps 40 and 41 between the stoppers 47 and 48 and the upper case 12 and lower case 13 be set larger than a deformation amount of the circuit board 11 in an out-of-surface direction (vertical direction in the drawing) in the temperature variation range in the usage environment of the electronic components 18.

By employing such a housing structure, it becomes possible to enhance the connection reliability of the circuit board 11 and the electronic components 18, and improve the reliability with respect to excessive deformation caused by impact or the like.

Incidentally, the columnar stoppers 47 and 48 are mounted by soldering or the like, and can be mounted in the same manner as the other electronic components 18 and 23, and hence the stoppers 47 and 48 can be formed without increasing the number of manufacturing steps.

In the housing structure shown in FIG. 3, although the stoppers 47 and 48 are provided on both the surfaces of the circuit board 11, one of the stoppers 47 and 48 may be provided on one of both the surfaces of the circuit board 11.

Figure 4:
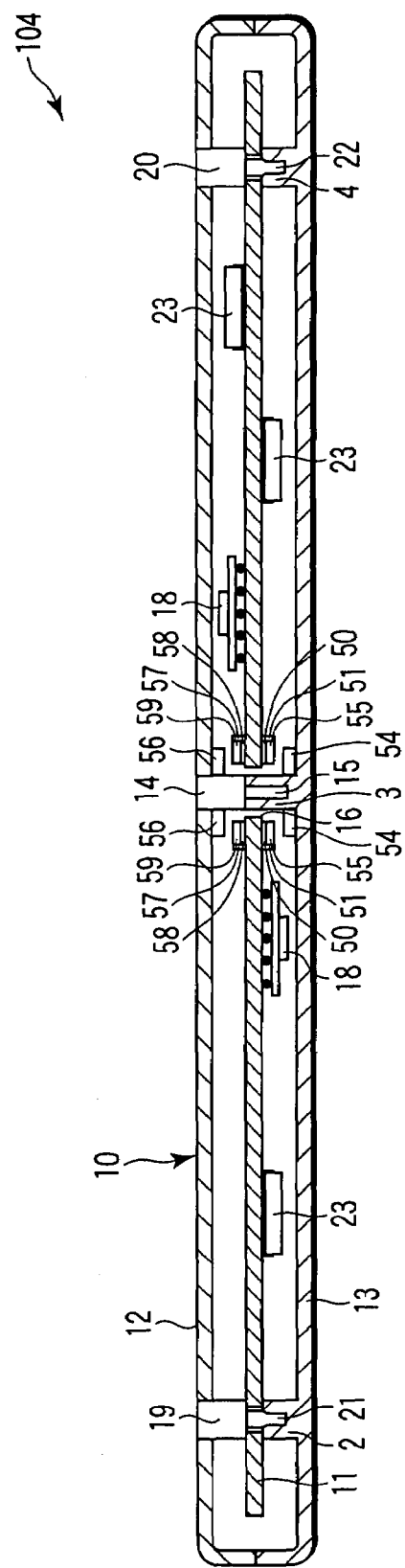
FIG. 4 is a cross-sectional view schematically showing electronic equipment according to a fourth embodiment.

FIG. 4 is a cross-sectional view showing electronic equipment according to a fourth embodiment of the present invention.

This electronic equipment 104 comprises, like the housing structure shown in FIG. 1, an upper case 12 in which boss sections 14, 19, and 20 are formed, and a lower case 13 in which boss sections 3, 2, and 4 to be engaged with the boss sections 14, 19, and 20 are formed. Further, like the housing structure shown in FIG. 1, a circuit board 11 is accommodated in the upper case 12 and the lower case 13, has a hole 16 having a diameter larger than those of the boss section 14 and boss section 3, and is arranged such that the boss section 14 and the boss section 3 penetrate the hole 16. In the housing structure shown in FIG. 4, like in the housing structure shown in FIG. 1, a first stopper 56 and a second stopper 54 are provided at the proximal sections of the pedestal sections of the boss sections 14 and 3, and unlike in the housing structure shown in FIG. 1, pads 58 and 50 are formed in regions around the hole 16 on the front and rear surfaces of the circuit board 11. A third stopper 57 and a fourth stopper 51 are fixed to the pads 58 and 50. The third stopper 57 and the fourth stopper 51 are opposed to the first stopper 56 and the second stopper 54, respectively. Further, gaps 59 and 55 are formed between the third stopper 57 and the first stopper 56, and between the fourth stopper 51 and the second stopper 54, respectively. Electronic components 18 and 23 are mounted on the circuit board 11 like in the housing structure shown in FIG. 1.

Further, in the boss sections 19 and 2, boss sections 14 and 3, and boss sections 20 and 22, like in the housing structure shown in FIG. 1, male screws 21, 15, and 22 are screw-engaged with corresponding female threaded holes, thereby causing the upper case 12 and lower case 13 to integrally constitute a case. Incidentally, the boss section 19 and boss section 2, and the boss section 20 and boss section 4 fix the circuit board 11 to the inside of the housing by the screws 21 and 22. However, like in the housing structure shown in FIG. 1, the structure in which the boss section 14 and boss section 3 penetrate the hole 16, and the boss section 14 and boss section 3 are not fixed to the circuit board 11 is employed.

Accordingly, even when the circuit board 11 is deformed by thermal stress or external stress, the stress is prevented from being concentrated at the region of the circuit board 11 around the boss section 14 and boss section 3 because the boss section 14 and boss section 3 are not fixed to the circuit board 11. Accordingly, an adverse influence of the stress on the soldered connections of the electronic components 18, particularly, on the soldered connections of the electronic components 18 arranged in the region on the circuit board 11 in the vicinity of the boss sections 14 and 3 can be alleviated.

Further, when the external impact is large, variation of the circuit board 11 can be limited by the first stopper 56 and second stopper 54 provided around the boss section 14 and boss section 3, and the third stopper 57 and fourth stopper 51 provided around the hole 16 on the circuit board 11. As a result, it is possible to prevent the electronic components 18 from colliding against the upper case 12 and lower case 13. In this case, the gaps 59 and 55 held between the first stopper 56 and second stopper 54 and between the third stopper 57 and fourth stopper 51, respectively, are set such that the electronic components 18 adjacent to the stoppers 57 and 51 do not collide against the upper case 12 and lower case 13, respectively. Further, it is desirable that the gaps 59 and 55 be set larger than a deformation amount of the circuit board 11 in an out-of-surface direction (vertical direction in the drawing) in the temperature variation range in the usage environment of the electronic components 18.

By employing such a housing structure, it becomes possible to enhance the connection reliability of the circuit board 11 and the electronic components 18, and improve the reliability with respect to excessive deformation caused by impact or the like.

Incidentally, the first stopper 56 and the second stopper 54 are constituted of a flexible structure body having a cylindrical shape which is an elastic body such as rubber, and the third stopper 57 and the fourth stopper 51 are soldered by using a soldering material.

Although the modulus of elasticity of the circuit board 11 is about several tens of Gpa at room temperature, it is desirable that the modulus of elasticity of the first stopper 56 and the second stopper 54 be about several Mpa to several tens of Mpa, and the first stopper and the second stopper should have stiffness sufficiently smaller than that of the circuit board 11.

In this embodiment, the first stopper 56 and the second stopper 54 are provided at both the boss sections 14 and 3, and both the third stopper 57 and the fourth stopper 51 are provided so as to be opposed to the first stopper 56 and the second stopper 54, respectively. However, it is evident that one of a set of the first stopper 56 and the third stopper 57 opposed to the stopper 56, and a set of the second stopper 54 and the fourth stopper 51 opposed to the stopper 54 may be provided.

In each of the housing structures shown in FIGS. 1 to 4, a hole is provided in the circuit board, boss sections for engaging the upper and lower cases with each other are made to penetrate the hole, and stoppers for preventing the circuit board from being brought into contact with the case are provided around the bosses. As a result, the circuit board is not fixed by the bosses, thermal stress or external stress is alleviated, and the circuit board is prevented from being brought into contact with the case by the stoppers, whereby a fault caused by collision impact can also be prevented. Accordingly, it is possible to provide electronic equipment capable of maintaining reliability at joints of electronic components.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic equipment comprising:
    a housing having a hollow cavity, comprising first and second cases, the first case having a first inner surface and a first projection formed on the inner surface, the second case having a second inner surface and a second projection formed on the second inner surface, the second projection being engaged with the first projection;
    a circuit board which is provided in the hollow housing, has a hole having a diameter larger than those of the first and second projections, and is arranged in such a manner that the first projection or the second projection is inserted in the hole; and
    a first stopper provided around one of the first and second projections so as to provide a gap between the first stopper and the circuit board.

2. The electronic equipment according to claim 1, further comprising:
    a second stopper provided around the other of the first and the second projections so as to provide a gap between the second stopper and the circuit board.

3. The equipment according to claim 2, wherein the first and second stoppers are made of an elastic material.

4. The equipment according to claim 2, wherein the first and second stoppers are made of an adhesive material.

5. The equipment according to claim 2, wherein the first and second stoppers are fixed by soldering.

6. An electronic equipment comprising:
    a housing having a hollow cavity, comprising first and second cases, the first case having a first inner surface and a first projection formed on the inner surface, the second case having a second inner surface and a second projection formed on the second inner surface, the second projection being engaged with the first projection;
    a circuit board which is provided in the hollow housing, has a hole having a diameter larger than those of the first and second projections, and is arranged in such a manner that the first projection or the second projection is inserted in the hole; and
    first stoppers arranged around the hole on one of front and rear surfaces of the circuit board so as to provide gaps between the first stoppers and the one of the first and second inner surfaces.

7. An electronic equipment according to claim 6, further comprising second stoppers arranged around the hole on the other of the front and rear surfaces so as to provide gaps between the second stoppers and the other of the first and second inner surfaces.

8. The equipment according to claim 7, wherein the first and second stoppers are made of an elastic material.

9. The equipment according to claim 7, wherein the first and second stoppers are made of an adhesive material.

10. The equipment according to claim 7, wherein the first and second stoppers are fixed by soldering.

11. An electronic equipment comprising:
    a housing having a hollow cavity, comprising first and second cases, the first case having a first inner surface and a first projection formed on the inner surface, the second case having a second inner surface and a second projection formed on the second inner surface, the second projection being engaged with the first projection;
    a circuit board which is provided in the hollow housing, has front and rear surfaces and a hole having a diameter larger than those of the first and second projections, and is arranged in such a manner that the first projection or the second projection is inserted in the hole; and
    first stoppers provided around one of the first and second projections, respectively; and
    second stoppers provided around the hole on one of the front and rear surfaces which faces to the one of the first and second projections so as to provide gaps between the first stoppers and the second stoppers.

12. The electronic equipment according to claim 11, further comprising:
    third stoppers provided around the other of the first and second projections; and
    fourth stoppers provided around the hole on the other of the front and rear surfaces so as to provide gaps between the third stopper and the fourth stopper.

13. The equipment according to claim 12, wherein the first to fourth stoppers are made of an elastic material.

14. The equipment according to claim 12, wherein the first to fourth stoppers are made of an adhesive material.

15. The equipment according to claim 12, wherein the first to fourth stoppers are fixed by soldering.

* * * * *